United States Patent [19]

Ward

[11] Patent Number: 4,476,172

[45] Date of Patent: Oct. 9, 1984

[54] PELLICLE COMPOSITIONS AND PELLICLES THEREOF FOR PROJECTION PRINTING

[75] Inventor: Irl E. Ward, Easton, Pa.

[73] Assignee: J. T. Baker Chemical Company, Phillipsburg, N.J.

[21] Appl. No.: 486,082

[22] Filed: Apr. 18, 1983

[51] Int. Cl.³ ............................................... C08L 83/06
[52] U.S. Cl. ...................................... 428/38; 428/447; 428/524; 525/58; 525/61
[58] Field of Search ........................ 355/53, 54, 30, 18, 355/67, 75, 76, 77; 428/38, 447, 524, 437; 430/66; 525/58, 61

[56] References Cited

U.S. PATENT DOCUMENTS

| | | | |
|---|---|---|---|
| Re. 30,601 | 5/1981 | Horr | 355/76 |
| 4,110,762 | 8/1978 | Tigrent | 354/4 |
| 4,131,363 | 12/1978 | Shea | 355/75 |
| 4,148,637 | 4/1979 | Kubota | 96/1.5 N |
| 4,250,240 | 2/1981 | Shimada | 430/66 |
| 4,413,025 | 11/1983 | Haga et al. | 525/58 |

*Primary Examiner*—William J. Van Balen
*Attorney, Agent, or Firm*—George W. Rauchfuss, Jr.

[57] ABSTRACT

A pellicle for use in projection printing comprises a pellicle in which the transparent film is formed from the novel film forming reaction product of a polyvinyl butyral resin with a silane. Pellicles employing such films are useful in the near, mid and deep UV regions.

20 Claims, No Drawings

PELLICLE COMPOSITIONS AND PELLICLES THEREOF FOR PROJECTION PRINTING

FIELD OF THE INVENTION

This invention relates to pellicles for use in projection printing wherein said pellicles can be used in the deep UV region as well as the mid and near UV regions and to castable compositions for preparing films for use in said pellicles.

BACKGROUND OF THE INVENTION

In the field of projection printing and especially in the semiconductor industry and in the manufacture of integrated circuits the use of pellicles to shield a photomask from airborne particulate matter has gained increasing acceptance and use because of the multitude of benefits derived from their use. The employment of a pellicle for projection printing is described, for example, in U.S. Pat. No. 4,131,363, issued Dec. 26, 1978 to V. Shea et al. and assigned to International Business Machines Corp. The use of such pellicles in projecting printing has resulted in a reduction in mask and printing defects, increased mask reticle life, reduced aligner downtime, increased mask quality and increased device and reticle yield. Materials employed in the prior art and suitable for the production of films utilizable as pellicle films include polymer films of polyoxyethylene terephthalate, nitrocellulose and parylene.

The prior art polymer films while finding usefulness in projection printing systems as pellicle films have been severely limited in their usefulness. For example, while pellicles of such polymer films are useful in the near UV region (wavelengths 340–436 nm) and some usefulness in the mid UV region (wavelengths 280–340 nm) none has been acceptable for use in the deep UV region (wavelength 200–280 nm). Prior art pellicle films, while providing acceptable properties for use in the near and mid UV regions, have not provided acceptable light transmission properties in the deep UV region and thereby cannot be utilized in the deep UV region.

Furthermore, due to the advancing state of the art in this projection printing field and in view of image geometries of less than 2 microns and device packing density approaching the VLSI and VHSI it is highly advantageous that projection imaging wavelength in the deep UV region be employed. Heretofore it has not been possible to enjoy the benefits derived from the use of pellicles in this deep UV region because of the unavailability of any pellicle acceptable for use in the deep UV region.

Additionally, although the prior art pellicle films have found usefulness in the near and mid UV regions, their performance has not been entirely satisfactory. Among the many factors detracting from their usefulness in these regions is the fact that their light transmission properties are not substantially 100 percent at the projection wavelengths but rather are generally 98% or less. Also, film tensile strength of the pellicle films has generally been in the range of 3,000–5,000 psi and the need for a film of increased tensile strength to increase the pellicle film life is desirable. Additionally, the percent of undesirable light scattering in said prior art pellicle films has generally been in the range of 0.3% at 365 nm. A film of decreased light scattering is highly desirable. Also with the prior art pellicle films, the percent etaloning, namely the difference between peak and minimum transmission, has only been as low as about 18% and it is of great advantage to reduce such etaloning as much as possible to increase the light transmission properties of the pellicles. Moreover, the prior art pellicle films, while desiring to obtain the best uniformity of film thickness so as to decrease exposure variations through the pellicle, have generally only obtained films with thickness variations of about 500 Å/cm. It is certainly preferred to obtain an otherwise acceptable film which has a much lower variation in film thickness. Prior art films have also suffered greatly from undesirable film defects such as haze, imbedded particles, pinholes, film gels, speckles, striations and other optical defects, which have adversely affected the overall performance of the pellicle films.

It is therefore highly desirable that a pellicle film be available which is useful in the deep UV region and which is as good or better in performance characteristics and/or physical properties as has been the case with pellicle films used in the mid or near UV regions. Moreover, it is also highly desirable that such pellicle film be useful in all three UV regions and that the performance characteristics and/or physical properties of such pellicle film in the mid and near UV regions be improved in whole or in part compared to the performance characteristics and/or physical properties of the materials heretofore employed in the prior art for pellicle films in the mid or near UV regions.

SUMMARY OF THE INVENTION

It has been discovered that a transparent film of the film forming reaction product of a polyvinyl butyral polymer with certain silane compounds is suitable for use as a pellicle film and that pellicles made therefrom can be used in projection printing in the near, mid and deep UV regions and have high light transmission properties as well as performance characteristics and/or physical properties as good as or better than pellicle films heretofore available which were usable only in the mid or near UV region.

DETAILS OF THE INVENTION

A cast pellicle film suitable for use in the deep UV region as well as the near and mid UV regions and which possesses suitable light transmission properties in each of said UV regions as well as possessing suitable performance characteristics and/or physical properties is formed by casting a film of the film-forming polymeric reaction product of a polyvinyl butyral of the general formula

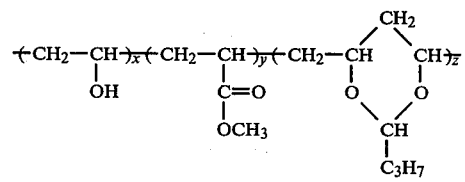

wherein X is $\leq 0.12$; y is $\leq 0.02$ and z is $\geq 0.88$, with certain silane compounds of the formula

wherein R is methyl or ethyl; m is a whole number equal to 1, 2 or 3; n is a whole number equal to $4-m$; and G is

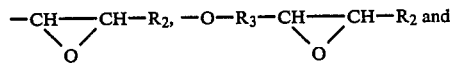

wherein p is 0, 1, 2, 3 or 4 and Q is selected from the group consisting of —$R_1$, —$OR_1$,

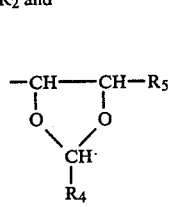

when p is 1, 2, 3 or 4 and Q is selected from the group consisting of —$R_1$,

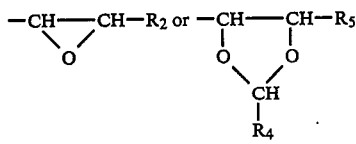

when p is equal to zero, wherein $R_1$ is alkyl of 1 to 4 carbon atoms; $R_2$, $R_4$ and $R_5$ are selected from the group consisting of hydrogen and $R_1$, and $R_3$ is alkylene of 1 to 4 carbon atoms.

In said polyvinyl butyral the hydroxyl content of the polymer expressed as percent polyvinyl alcohol is equal to or less than 12%, generally from about 9 to 12%, the acetate content expressed as percent polyvinyl acetate is equal to 2.5% or less, generally from about 0 to 2.5%, and the butyral content expressed as percent polyvinyl butyral is at least about 88%. That is, while x, y and z are as defined above they preferably are defined as x is 0.09 to 0.12, y is 0.00 to 0.02 and z is equal to or greater than 0.88. A suitable polyvinyl butyral meeting said criteria is BUTVAR ® B-79 polyvinyl butyral resin of the Monsanto Company of St. Louis, Mo., USA as described in their Technical Bulletin No. 6070D.

A preferred group of silanes for reaction with the polyvinyl butyral comprises silanes of the hereinbefore set forth general formula wherein m is equal to 3 and n is equal to 1. A still more preferred group of silanes- for reaction with the polyvinyl butyral comprise silanes of the hereinbefore set forth general formula wherein m is equal to 3, n is equal to 1 and G is

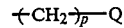

wherein p is equal to 3. Even still more preferred are those silanes within the still more preferred group where Q is

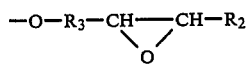

and $R_3$ is

and $R_2$ is hydrogen.

A most preferred silane for reaction with the polyvinyl butyral comprises a silane compound of the general formula set forth hereinbefore wherein R is methyl, m is 3, n is 1, G is

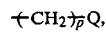

p is 3 and Q is

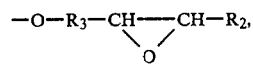

$R_3$ is

and $R_2$ is hydrogen, namely 3-glycidoxy propyl trimethoxy silane.

As examples of silanes that may be employed in the process of this invention there may be mentioned for example:
3-glycidoxy propyl triethoxy silane
methyl trimethoxy silane
3-methoxypropyl triethoxy silane
3-methoxypropyl trimethoxy silane
dimethyl dimethoxy silane
4,5-epoxypentyl trimethoxy silane
4-(3'-methyl-2',3',-glycidoxy) butyl trimethoxy silane
4,5-ethylidenidioxypentyl trimethoxy silane
2,3-methylidenedioxybutyl trimethoxy silane
trimethyl methoxy silane
2-glycidoxyethyl trimethoxy silane The polyvinyl butyral and silane are reacted in substantially stoichiometrically equivalent quantities in any suitable volatile, non-hydrolyzing solvent, free of active hydrogen and which is inert to the polyvinyl butyral, such as for example, methyl ethyl ketone or dimethylformamide. The reaction is carried out in the presence of a catalytic amount of water, for example, about 0.05% weight water, at a temperature of from about room temperature of about 20° C. to about 95° C., preferably at about 65° C., for a period of several minutes to several hours, preferably from about 10 to about 60 minutes and more preferably for about 20 to about 40 minutes.

For purposes of illustrating the likely reaction mechanism between the polyvinyl butyral and the silane, the polyvinyl butyral will be represented by the shortened general formula

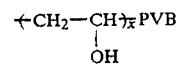

wherein x is $\leq 0.12$. It is believed that the reaction between the polyvinyl butyral and silane proceeds as follows:

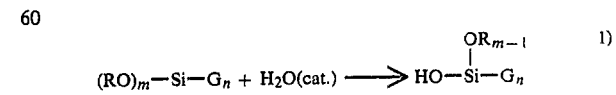

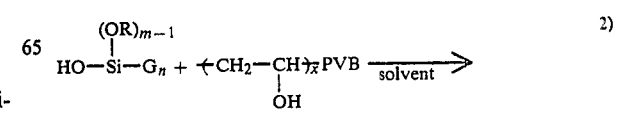

-continued

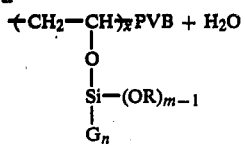

wherein m, n, x, R and G are as defined hereinbefore. The water formed in reaction (2) propagates reaction (1). The reaction may be terminated and cross linking of the polymeric reaction product prevented by the addition of any suitable monohydroxy solvent such as 2-ethoxyethanol or the like which acts as a chain terminator.

The reaction product is a film forming polymer containing the following repeating structural unit:

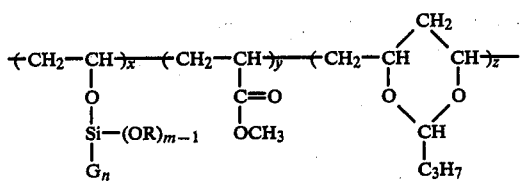

wherein x, y, z, R, m, n and G are as defined hereinbefore.

The castable solutions of these film forming polymers can be cast on wafer surfaces, the film formed and cured, removed from the wafer and mounted between pellicle mounting rings to form pellicles according to this invention. The film of the pellicle will generally be from about 0.5 to about 4 microns thick although films above and below this range are also possible.

The invention is illustrated by reference to the following examples which are merely illustrative and not limiting of this invention.

EXAMPLE 1

About 35.45 grams of polyvinyl butyral, BUTVAR ® B-79, is dissolved in 127.29 grams dimethylformamide at a temperature of about 25° to 30° C. with stirring until a clear viscous solution is obtained. The solution is heated to about 65° C. and 18.78 grams 3-glycidoxy propyl trimethoxy silane are added. The temperature of the solution is maintained at about 65° C. for about 20 to 25 minutes and then cooled to about 25° C. whereupon 191.29 grams 2-ethoxyethanol is added with stirring for about 25 minutes to produce the film forming polymeric product having the repeating structural unit

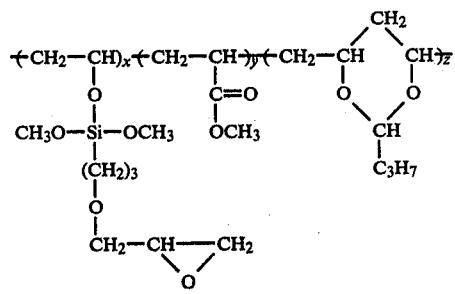

EXAMPLE 2

The film-forming polymeric solution of Example 1 is poured onto a flat polished substrate, such as a 5" clean-dry silicon wafer, such that the substrate is flooded with solution, approximately 10 to 20 ml, before spinning begins. The flooded substrate is then spun at 2000 to 5000 rpm, preferably 2500 rpm, for 30 to 120 seconds, preferably about 60 seconds, to form a uniform film having a thickness of from about 0.5 to 4.0 μm. The resulting cast, uniform film is cured by removal of the volatile components of the cast film. Removal of the volatile solvent components can be by any suitable means, such as by standing at room temperature for 12 or more hours at 40% relative humidity or by heating in a convection oven at about 40° to 100° C., preferably about 60° C., for a period of from about 30 to 240 minutes, preferably about 2 to 3 hours, followed by cooling to ambient temperature.

The cured film is then removed from the substrate. Removal can be, for example, by the following preferred method. The cured film is scored all around the wafer but in from the wafer edge (that is, in about 0.5 to 1.0 mm) using any suitable scoring instrument such as a razor knife. A round flexible ring, for example, a 5¾" diameter aluminum ring, having adhesive on one side is pressure attached to the periphery of the scored coated substrate. The film attached to the flexible ring is then peeled from the substrate under any suitable non-reactive inert fluid, such as water. The free film attached to the flexible ring is then evenly tensioned and attached sag free to a pellicle mounting ring by any suitable anchoring technique, such as, adhesive attachment to one side of a single pellicle mounting ring or by clamping the film between an interacting pair of pellicle mounting rings.

EXAMPLE 3

Following the procedure set forth in Example 1, similar film forming polymeric solutions can be prepared by employing an equivalent molar proportion of the following silane compounds in place of the 3-glycidoxy propyl trimethoxy silane in said Example, namely:

3-glycidoxy propyl triethoxy silane
methyl trimethoxy silane
3-methoxypropyl triethoxy silane
3-methoxypropyl trimethoxy silane
dimethyl dimethoxy silane
4,5-epoxypentyl trimethoxy silane
4-(3'-methyl-2',3',-glycidoxy) butyl trimethoxy silane
4,5-ethylidenidioxypentyl trimethoxy silane
2,3-methylidenedioxybutyl trimethoxy silane
trimethyl methoxy silane
2-glycidoxyethyl trimethoxy silane

EXAMPLE 4

Following the casting procedure described in Example 2, the film forming polymeric solutions of Example 3 can be employed to form pellicle films.

The pellicle films of this invention are useful in the deep UV region as well as the mid and near UV region. Additionally, the performance characteristics of the films of this invention in the near and mid UV regions are improved in numerous aspects. Moreover, the films of this invention are characterized by high light transmission properties.

For example, pellicle films of this invention possess essentially 100% light transmission over the near and mid UV regions whereas previously pellicle films produced at most only about 98% transmission. The pellicle films of this invention also possess high light transmission properties in the deep UV region, exhibiting 99% or more transmission at 250 nm and more than 95% transmission down to wavelength of about 210 nm. The films also possess the necessary tensile strength, namely about 8,000 to 10,000 psi or more. The light scattering of these films is less than about 0.1% at 365 nm and the etaloning is in the range of 14 to 15% with the film of Example 2. Moreover, the films possess greatly improved film thickness uniformity showing less than 80 Å/cm film thickness variation by phase measuring interferometry over a 4″ diameter pellicle film. Additionally, the film are characterized by high film integrity, that is, being substantially free of haze, imbedded particles, pinholes, film gels, speckles, striatures or other optical defects. Also, the films can withstand from about 10,000 to 20,000 or more exposures in the deep UV region, namely at 240-270 nm, as simulated by continuous exposure of the pellicle film to the appropriately filtered static exposure light source, before degradation of the pellicle film due to the burning of an arc into the film. Moreover, the pellicle films of this invention can be cleaned of foreign particulate material by water cleaning, such as by water spraying or immersion in water for short periods of time, without adverse effects on the pellicle or any swelling of the pellicle film.

I claim:

1. A pellicle film for use in projection printing comprising a film formed from a film forming polymer having the following structural unit:

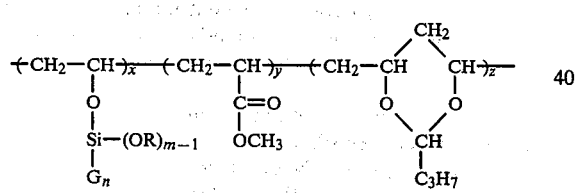

wherein x is $\leq 0.12$, y is $\leq 0.02$ and z is $\geq 0.88$, R is methyl or ethyl, m is a whole integer of 1, 2 or 3, n is a whole integer equal to $4-m$, and G is

wherein p is 0, 1, 2, 3 or 4 and Q is a member selected from the group consisting of $-R_1$, $-OR_1$,

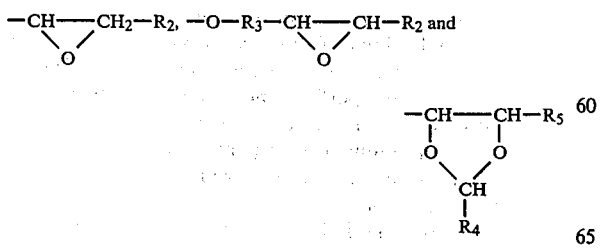

when p is 1, 2, 3 or 4 and Q is selected from the group consisting of $-R_1$,

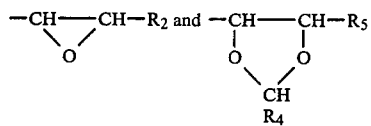

when p is equal to 0,
wherein $R_1$ is alkyl of 1 to 4 carbon atoms, $R_2$, $R_4$ and $R_5$ are selected from the group consisting of hydrogen and $R_1$, and $R_3$ is alkylene of 1 to 4 carbon atoms.

2. A castable solution of a film forming polymer comprising a polymer having the following structural unit:

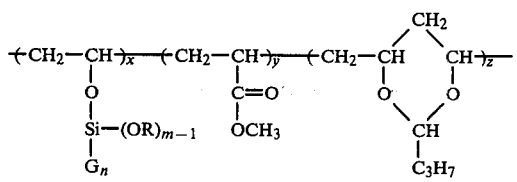

wherein x is $\leq 0.12$, y is $\leq 0.02$ and z is $\geq 0.88$, R is methyl or ethyl, m is a whole integer of 1, 2 or 3, n is a whole integer equal to $4-m$, and G is

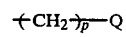

wherein p is 0, 1, 2, 3 or 4 and Q is a member selected from the group consisting of $-R_1$, $-OR_1$,

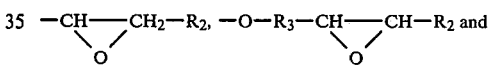

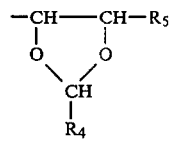

when p is equal to 1, 2, 3 or 4 and Q is selected from the group consisting of $-R_1$,

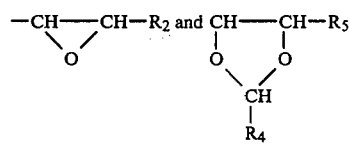

when p is equal to zero
wherein $R_1$ is alkyl of 1 to 4 carbon atoms, $R_2$, $R_4$ and $R_5$ are selected from the group consisting of hydrogen and $R_1$, and $R_3$ is alkylene of 1 to 4 carbon atoms.

3. A polymer having the following structural unit:

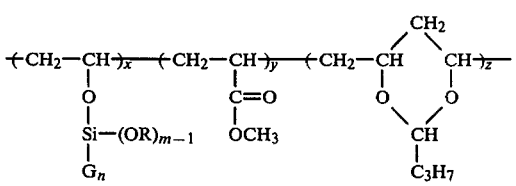

wherein x is ≦0.12, y is ≦0.02 and z is ≧0.88, R is methyl or ethyl, m is a whole integer of 1, 2 or 3, n is a whole integer equal to 4−m, and G is

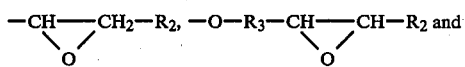

wherein p is 0, 1, 2, 3 or 4 and Q is a member selected from the group consisting of —$R_1$, —$OR_1$,

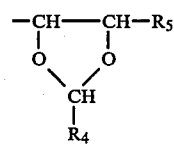

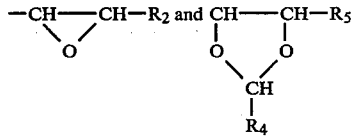

when p is equal to 1, 2, 3 or 4 and Q is selected from the group consisting of —$R_1$,

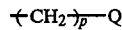 and 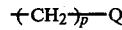

when p is equal to zero wherein $R_1$ is alkyl of 1 to 4 carbon atoms, $R_2$, $R_4$ and $R_5$ are selected from the group consisting of hydrogen and $R_1$, and $R_3$ is alkylene of 1 to 4 carbon atoms.

4. A pellicle film of claim 1 wherein x is from about 0.09 to 0.12, y is from about 0.0 to 0.02, m is 3 and n is 1.

5. A castable solution of claim 2 wherein x is from about 0.09 to 0.12, y is from about 0.0 to 0.02, m is 3 and n is 1.

6. A polymer of claim 3 wherein x is from about 0.09 to 0.12, y is from about 0.0 to 0.02, m is 3 and n is 1.

7. A pellicle film of claim 4 wherein G is

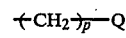

and wherein p is 3.

8. A castable solution of claim 5 wherein G is

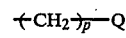

and wherein p is 3.

9. A polymer of claim 6 wherein G is

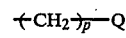

and wherein p is 3.

10. A pellicle film of claim 7 wherein Q is

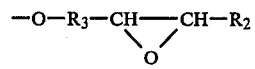

and wherein $R_3$ is

and $R_2$ is hydrogen.

11. A castable solution of claim 8 wherein Q is

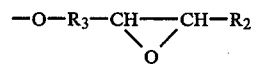

and wherein $R_3$ is

and $R_2$ is hydrogen.

12. A polymer of claim 9 wherein Q is

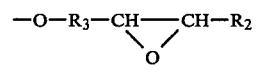

and wherein $R_3$ is

and $R_2$ is hydrogen.

13. A pellicle film of claim 10 wherein R is methyl.
14. A castable solution of claim 11 wherein R is methyl.
15. A polymer of claim 12 wherein R is methyl.
16. A pellicle for use in projection printing comprising a film of claim 1 mounted in a pellicle mounting ring.
17. A pellicle for use in projection printing comprising a film of claim 4 mounted in a pellicle mounting ring.
18. A pellicle for use in projection printing comprising a film of claim 7 mounted in a pellicle mounting ring.
19. A pellicle for use in projection printing comprising a film of claim 10 mounted in a pellicle mounting ring.
20. A pellicle for use in projection printing comprising a film of claim 13 mounted in a pellicle mounting ring.

* * * * *